United States Patent [19]

Maemoto et al.

[11] Patent Number: 4,876,173

[45] Date of Patent: Oct. 24, 1989

[54] PHOTOPOLYMERIZABLE COMPOSITION ON POLYETHYLENE TEREPHTHALATE FILM SUPPORT

[75] Inventors: Kazuo Maemoto, Kanagawa; Masayuki Iwasaki; Minoru Maeda, both of Shizuoka; Yoshimasa Aotani, Kanagawa, all of Japan

[73] Assignee: Fuji Photo Film Co., Ltd., Kanagawa, Japan

[21] Appl. No.: 240,455

[22] Filed: Sep. 2, 1988

Related U.S. Application Data

[63] Continuation of Ser. No. 42,550, Apr. 21, 1987, abandoned, which is a continuation-in-part of Ser. No. 824,343, Jan. 23, 1986, abandoned.

[30] Foreign Application Priority Data

Jan. 23, 1985 [JP] Japan ................................. 60-10271

[51] Int. Cl.$^4$ ................................. G03C 1/76
[52] U.S. Cl. ................................. 430/271; 430/273; 430/281; 430/288; 430/910; 522/101; 522/165
[58] Field of Search ............... 430/271, 281, 910, 288, 430/273; 522/20, 101, 165

[56] References Cited

U.S. PATENT DOCUMENTS

| | | | |
|---|---|---|---|
| 4,284,707 | 8/1981 | Nagasawa et al. | 430/286 |
| 4,289,843 | 9/1981 | Boutle et al. | 430/271 |
| 4,559,292 | 12/1985 | Geissler et al. | 430/271 |

*Primary Examiner*—Jack P. Brammer
*Attorney, Agent, or Firm*—Sughrue, Mion, Zinn, Macpeak & Seas

[57] ABSTRACT

A photopolymerizable composition is described, comprising an addition polymerizable unsaturated compound having at least two ethylenically unsaturated double bonds per molecule, a photopolymerization initiator, and a binder, wherein said binder is a copolymer represented by formula (I)

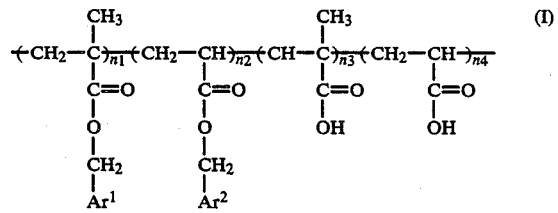

wherein $Ar^1$ and $Ar^2$ each represent a substituted or unsubstituted phenyl group; and $n_1$, $n_2$, $n_3$, and $n_4$ each represents mol % of the respective repeating unit, wherein $n_1$ is from 0 to about 70; $n_2$ is from 0 to about 70; $n_3$ is from about 5 to 50; and $n_4$ is from about 5 to 50; provided that $n_1$ and $n_2$ are not 0 at the same time, the sum of $n_3$ and $n_4$ is from about 30 to 80. The composition is useful as an alkali-developable light-sensitive layer which provides a photosensitive dry film resist having excellent performance characteristics.

14 Claims, No Drawings

PHOTOPOLYMERIZABLE COMPOSITION ON POLYETHYLENE TEREPHTHALATE FILM SUPPORT

This is a continuation of application Ser. No. 07/042,550, filed on 4/21/87, now abandoned which is a continuation-in-part of Ser. No. 06/824,343, filed on 1/23/86 now abandoned.

FIELD OF THE INVENTION

This invention relates to a novel photopolymerizable composition, and, more particularly, to an improved photopolymerizable composition which can be developed with a weakly alkaline aqueous solution containing no organic solvent, and which is particularly suitable for photosensitive dry film resists.

BACKGROUND OF THE INVENTION

For development of photopolymerizable compositions, organic solvents have hitherto been employed as developers, but organic solvents are, in general, expensive, poisonous, and combustible. Moreover, use of organic solvents entails high cost for countermeasures against health in working environment and environmental pollution. Therefore, it has been strongly desired to obtain a photopolymerizable composition that is developable without using such organic solvents. To this effect, it is noted that solubility and other properties of photopolymerizable compositions generally depend on the kind of binders used in the compositions.

Representative publications describing alkalidevelopable photopolymerizable compositions are set forth below. Examples of the binders whose use is described in these publications are shown in parentheses, since the main properties of the compositions are predominantly decided by the binders used therein.

- Japanese Patent Publication No. 34327/79 (corresponding to U.S. Pat. No. 3,804,631)
  (methyl methacrylate/2-ethylhexyl methacrylate/methacrylic acid terpolymer)
- Japanese Patent Publication No. 38961/80 (corresponding to U.S. Pat. No. 3,887,450)
  (styrene/mono-n-butyl maleate copolymer)
- Japanese Patent Publication No. 25957/79
  (styrene/methyl methacrylate/ethyl acrylate/methacrylic acid tetrapolymer)
- Japanese Patent Application (OPI) No. 99810/77 (the term "OPI" herein used refers to a "published unexamined application")
  (benzyl methacrylate/methacrylic acid copolymer)
- Japanese Patent Publication No. 12577/83
  (acrylonitrile/2-ethylhexyl methacrylate/methacrylic acid terpolymer)
- Japanese Patent Publication No. 6210/80
  (methyl methacrylate/ethyl acrylate/acrylic acid terpolymer, and isopropanol-partially esterified styrene/maleic anhydride copolymer)

Photopolymerizable compositions are used for various purposes as in, e.g., lithographic printing plates, resin letterpress plates, photomasks, photosensitive dry film resists, and the like. The photosensitive dry film resists comprise a film support having provided thereon a photoresist layer (hereinafter referred to as photosensitive layer) and a protective layer, as described in Japanese Patent Publication No. 25231/70 (corresponding to U.S. Patent 3,469,982).

The photosensitive dry film resist is used in the production of printed circuit boards. That is, after the protective film is stripped, the photosensitive layer is laminated on a copper-clad base under heat and pressure. The laminate is then imagewise exposed to light through a negative original in contact with the film support. The film support is removed, and the unexposed areas are removed (developed) by a developing solution, to thereby obtain a resist image on the copper surface. Then, the copper surface covered with the resist is protected by the following etching step (dissolving and removing the copper surface) and plating step (depositing solder, copper, etc. on the copper surface). Thereafter, the resist image is peeled off, and if necessary, the base surface is further subjected to etching, to thereby produce a printed circuit board.

The photosensitive layer is classified into the so-called alkali-developable type that the unexposed areas can be removed (developed) by an alkali aqueous solution and the so-called solvent-developable type that the unexposed areas can be removed by an organic solvent. Attention has recently been directed to the former alkalidevelopable type because of safety and health in the working environment and low cost for the treatment.

However, the alkali-developable photosensitive dry film resists using the aforesaid conventional binders have many problems in performance in spite of their advantages. Specifically, the resist image lines have poor resolving power and lacks faithful reproducibility of original lines; the edges of the resist image are not sharp; and the tenting strength is low. These disadvantages are attributed to the fact that conventional known photosensitive layers cannot provide a resist image having sufficient resistance to a developing solution; that the dry film resist has poor adhesion to a base; and that the photosensitive layer has insufficient solubility in the alkaline aqueous solution.

SUMMARY OF THE INVENTION

An object of this invention is to overcome the above-described disadvantages associated with the conventional alkali-developable photosensitive layer, i.e., to provide a photosensitive layer which can be developed with a weakly alkaline aqueous solution in a short time, has flexibility sufficient to intimately laminate on a base and high adhesion to a base with less tackiness on its surface, is not so soft as to undergo cold flow during preservation, forms a polymer excellent in swell-resistance against a developing solution upon imagewise exposure to light, forms a highly adhesive tent by tenting, and can be peeled off by treating with a dilute aqueous solution of a strong alkali containing no organic solvent.

Another object of this invention is to provide a photosensitive layer having high resolving power and high reproducibility of an image of an original (phototool).

The present inventors have found that the above objects can be accomplished by the following photopolymerizable composition, and thus accomplished the present invention.

That is, the present invention relates to a photopolymerizable composition comprising an addition polymerizable unsaturated compound having at least two ethylenically unsaturated double bonds per molecule, a photopolymerization initiator, and a binder, wherein said binder is a copolymer represented by formula (I)

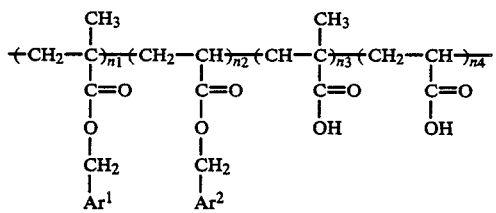

(I)

where $Ar^1$ and $Ar^2$ each represent a substituted or unsubstituted phenyl group; and $n_1$, $n_2$, $n_3$ and $n_4$ each represents mol% of the respective repeating unit, wherein $n_1$ is from 0 to about 70; $n_2$ is from 0 to about 70; $n_3$ is from about 5 to 50; and $n_4$ is from about 5 to 50; provided that $n_1$ and $n_2$ are not 0 at the same time, the sum of $n_1$ and $n_2$ is from about 20 to 70, and the sum of $n_3$ and $n_4$ is from about 30 to 80.

DETAILED DESCRIPTION OF THE INVENTION

In the above-described formula (I), $Ar^1$ and $Ar^2$ specifically include phenyl, p-methylphenyl, mmethylphenyl, o-methylphenyl, p-ethylphenyl, o-ethylphenyl, p-isopropylphenyl, p-methoxyphenyl, p-chlorophenyl, m-chlorophenyl, o-chlorophenyl, p-bromophenyl, 2,4-dimethylphenyl, 3,4-dimethylphenyl, and 3,4-dimethoxyphenyl groups, with a phenyl group being particularly preferred.

$n_1$ and $n_2$ are not 0 at the same time and each is within about 70 mol %, with the sum thereof ranging from about 20 to about 70 mol %. If the sum of $n_1$ and $n_2$ is less than about 20 mol %, the adhesion of resist to a base is low, and if it is more than about 70 mol %, developability of the photosensitive layer(s) is poor. A particularly preferred sum of them is from about 45 to about 55 mol %.

$n_3$ is from about 5 mol % to about 50 mol %, and preferably from about 15 mol % to about 35 mol %. If it is less than about 5 mol %, cold flow of the photosensitive layer tends to occur during preservation. If it is more than about 50 mol %, softness of the photosensitive layer decreases. $n_4$ is from about 5 mol % to 50 mol %, and preferably from about 7 mol % to 30 mol %. If it is less than about 5 mol %, the adhesion of a resist to a base is low, and if it is more than about 50 mol %, cold flow tends to occur. The sum of $n_3$ and $n_4$ is from about 30 mol % to 80 mol %. When it is less than about 30 mol %, developability of the photosensitive layer is poor, and when it is more than about 80 mol %, the resist has reduced resistance to an alkali developing solution.

The copolymer represented by formula (I) generally has a weight average molecular weight ranging from about 10,000 to 500,000, and more preferably the weight average molecular weight from about 20,000 to 250,000. If it is less than about 10,000, the strength of a tent is deteriorated, and if it is more than about 500,000, developability of the photosensitive layer is poor.

The binder of the present invention can include one or more copolymers of formula (I) and contains insubstantial amounts of any other binder which would change the effects obtained with the one or more copolymers of formula (I), i.e., the binder of the present invention consists essentially of the one or more copolymers of formula (I).

The copolymer according to the present invention can be used as a binder in an amount of from about 20 to 80% by weight, and preferably from about 40 to 70% by weight, based on the total weight of a photopolymerizable composition.

Specific examples of the preferred copolymers of the formula (I) are shown in Table 1 below, but the present invention is not limited thereto.

TABLE 1

| Copolymer No. | Comonomer Composition (mol %) | Polymerization Solvent (Weight ratio 1/1) | Weight Average Molecular Weight |
|---|---|---|---|
| 1 | benzyl methacrylate (50) | methyl cellosolve | 100,000 |
|   | methacrylic acid (30) | methyl ethyl ketone | |
|   | acrylic acid (20) | | |
| 2 | benzyl methacrylate (55) | methyl cellosolve | 100,000 |
|   | methacrylic acid (20) | methyl ethyl ketone | |
|   | acrylic acid (25) | | |
| 3 | benzyl methacrylate (55) | methyl cellosolve | 90,000 |
|   | methacrylic acid (20) | methyl ethyl ketone | |
|   | acrylic acid (25) | | |
| 4 | benzyl methacrylate (55) | methyl cellosolve | 70,000 |
|   | methacrylic acid (20) | methyl ethyl ketone | |
|   | acrylic acid (25) | | |
| 5 | benzyl methacrylate (60) | methyl cellosolve | 110,000 |
|   | methacrylic acid (20) | methyl ethyl ketone | |
|   | acrylic acid (20) | | |
| 6 | benzyl methacrylate (55) | methyl cellosolve | 105,000 |
|   | methacrylic acid (25) | methyl ethyl ketone | |
|   | acrylic acid (20) | | |
| 7 | benzyl methacrylate (50) | 1-methoxy-2-propanol | 90,000 |
|   | methacrylic acid (30) | methyl ethyl ketone | |
|   | acrylic acid (20) | | |
| 8 | benzyl acrylate (50) | methyl cellosolve | 100,000 |
|   | methacrylic acid (30) | methyl ethyl ketone | |
|   | acrylic acid (20) | | |

SYNTHESIS EXAMPLE

Synthesis of Copolymer No. 1

440.5 g of benzyl methacrylate, 129.1 g of methacrylic acid, 72.1 g of acrylic acid, 642 g of methyl cellosolve and 642 g of methyl ethyl ketone were placed in a three-necked flask equipped with cooling tube, nitrogen-introducing tube and thermometer, then the mixture was stirred. Thereafter, 5.6 g of 2,2'-azobis(2,4-dimethylvaleronitorile) was added to the mixture in the stream of nitrogen at the internal temperature of 70° C. of the flask, then the resulting mixture was heated and stirred for 8 hours to obtain the copolymer No. 1.

Preferred examples of the addition polymerizable unsaturated compound having at least two ethylenically unsaturated double bonds per molecule include polyol acrylates or polyol methacrylates as described in Japanese Patent Publication Nos. 5093/60, 14719/60 and 28727/69 (corresponding to British Patent 1,154,872), e.g., diethylene glycol di(meth)acrylate, triethylene glycol di(meth)acrylate, tetraethylene glycol di(meth)acrylate, nonaethylene glycol di(meth)acrylate, pentaerythritol tri(meth)acrylate, trimethylolpropane tri(meth)acrylate, trimethylolpropane di(meth)acrylate, pentaerythritol tetra(meth)acrylate, dipentaerythritol penta(meth)acrylate, dipentaerythritol hexa(meth)acrylate, 1,6-hexanediol di(meth)acrylate, etc.; bis(meth)acrylamides, e.g., methylenebis(meth)acrylamide, ethylenebis(meth)acrylamide, m-xylylenebis(meth)acrylamide, etc.; compounds having an urethane group, e.g., di(2-methacryloxyethyl)2,4-tolylenediurethane, di(2-acryloxyethyl)hexamethylenediurethane, etc.; (meth)acrylurethane oligomers obtained by reacting a polyol and a diisocyanate and reacting the resulting isocyanate-terminated compound with a β-hydroxyalkyl (meth)acrylate, e.g., on oligomer obtained by reacting 4 mols of 2,4-tolylene diisocyanate with 3 mols of ethylene glycol and reacting the resulting reaction product with 1 mol of β-hydroxyethyl acrylate; diacrylates, e.g., 2,2-bis(hydroxyphenyl)propane, 2,2-bis(hydroxyethoxyphenyl)propane, 2,2-bis(hydroxyethoxyethoxyphenyl)propane, etc.; and the like. These polymerizable unsaturated compounds may be used either individually or in combinations of two or more thereof.

The addition polymerizable unsaturated compound is preferably present in the photopolymerizable composition in an amount of from about 7.5 to 55% by weight, and more preferably from about 15 to 45% by weight, based on the total weight of the photopolymerizable composition.

The photopolymerization initiator which is preferably used in the photosensitive layer of the present invention may be any one or combination of compounds capable of initiating polymerization of the aforesaid addition polymerizable unsaturated compounds. The photopolymerization initiator preferably is or contains at least one component having a molecular extinction coefficient of about 50 in the wavelength range of from about 3,000 to 8,000 Å, and preferably from 3,300 to 5,000 Å.

Specific examples of preferred photopolymerizable initiators include aromatic ketones, e.g., benzophenone, 4,4′-bis(dimethylamino)benzophenone, 4,4′-bis(diethylamino)-benzophenone, 4-methoxy-4′-dimethylaminobenzophenone, 4,4′-dimethoxybenzophenone, 4-dimethylaminobenzophenone, 4-dimethylaminoacetophenone, benzyl, anthraquinone, 2-t-butylanthraquinone, 2-methylanthraquinone, phenanthraquinone, xanthone, thioxanthone, 2-chloro-thioxanthone, 2,4-diethylthioxanthone, fluorenone, acridone, benzoin, etc.; benzoin ethers, e.g., benzoin methyl ether, benzoin ethyl ether, benzoin propyl ether, benzoin isopropyl ether, benzoin phenyl ether, benzyl dimethylketal, etc.; 2,4,5-triarylimidazole dimers, e.g., a 2-(o-chlorophenyl)-4,5-diphenylimidazole dimer, a 2-(o-chlorophenyl)-4,5-di(m-methoxyphenyl)imidazole dimer, a 2-(o-fluorophenyl)-4,5-diphenylimidazole dimer, a 2-(o-methoxyphenyl)-4,5-diphenylimidazole dimer, a 2-(p-methoxyphenyl)-4,5-diphenylimidazole dimer, etc.; polyhalogen compounds, e.g., carbon tetrabromide, phenyltribromomethylsulfone, phenyltrichloromethyl ketone, etc.; and the compounds disclosed in Japanese Patent Application (OPI) No. 133428/78, Japanese Patent Publication Nos. 1819/82 and 6096/82 and U.S. Pat. No. 3,615,455. These photopolymerization initiators can be used in combinations of two or more thereof as in a combination of a 2,4,5-triarylimidazole dimer and 2-mercaptobenzoxazole or Leuco Crystal Violet, etc.; a combination of 4,4′-bis(-dimethylamino)benzophenone and benzophenone or benzoin methyl ether as described in U.S. Patent 3,427,161); a combination of benzoyl-N-methylnaphthothiazolin and 2,4-bis(trichloromethyl)-6-(p-methoxyphenyl)-s-triazine as described in U.S. Pat. No. 4,239,850; and a combination of dimethylthoxanthone and a 4-dialkylaminobenzoic acid ester as described in Japanese Patent Application (OPI) No. 23602/82.

The photopolymerization initiator is preferably present in the photopolymerizable composition in an amount of from about 0.1 to 105 by weight, and more preferably from about 0.2 to 6% by weight, based on the total weight of the photopolymerizable composition.

The photosensitive layer of the present invention essentially comprises the photopolymerization initiator, ethylenically unsaturated compound and binder, and, if desired, may further comprise a heat polymerization inhibitor, a plasticizer, a dye, a color changing agent, a monofunctional ethylenically unsaturated compound, an agent for accelerating adhesion (adhesion accelerator) to a base, and other auxiliaries. Various performance characteristics of the resulting photosensitive layer, such as photographic properties, print-out effect, film properties, and the like can be controlled by addition of these additives.

Heat polymerization inhibitor is added to prevent the photosensitive layer from heat polymerization or polymerization with passage of time. Examples of the heat polymerization inhibitor include p-methoxy-phenol, hydroquinone, t-butyl catecholo, pyrogallol, 2-hydroxybenzophenone, 4-methoxy-2-hydroxybenzophenone, cuprous chloride, phenothiazine, chloranil, naphthylamine, β-naphthol, 2,6-di-t-butyl-p-cresol, nitrobenzene, dinitrobenzene, picric acid, p-toludine, etc.

Plasticizer is added to control film properties of the photosensitive layer and resit image. Examples of the plasticizer are phthalic esters, e.g., dibutyl phthalate, diheptyl phthalate, dioctyl phthalate, diallyl phthalate, etc.; glycol esters, e.g., triethylene glycol diacetate, tetraethylene glycol diacetate, etc.; phosphoric esters, e.g., tricresyl phosphate, triphenyl phosphate, etc.; amides, e.g., p-toluenesulfonamide, benzenesulfonamide, N-n-butylacetamide, etc.; aliphatic dibasic acid esters, e.g., diisobutyl adipate, dioctyl adipate, dimethyl sebacate, dioctyl azelate, dibutyl maleate, etc.; triethyl citrate, tributyl citrate, glycerin triacetyl ester, butyl laurate, dioctyl 4,5-diepoxycyclohexane-1,2-dicarboxylate, etc.

Examples of usable dyes are Brilliant Green, Eosine, Ethyl Violet, Erylthrosine B, Methyl Green, Crystal Violet, Basic Fuchsine, phenolphthalein, 1,3-diphenyl-triazine, Alizarin Red S, Thymolphthalein, Methyl Violet 2B, Quinaldine Red, Rose Bengale, Metanil Yellow, Thymolsulfophthalein, Zylenol Blue, Methyl Orange, Orange IV, diphenyl thiocarbazone, 2,7-dichlorofluorescein, Paramethyl Red A, Congo Red, Benzopurpurine 4B, α-Naphthyl Red, Nile Blue, Phenacetolin, Methyl Violet, Malachite Green, Parafuchsin, Oil Blue #603 (produced by Orient Chemical Co., Ltd.), Victoria Pure Blue BOH, Spiron Blue GN (produced by Hodogaya Chemical Co., Ltd.), Rhodamine B, Rhodamine 6G, etc.

The color changing agent is added to the photosensitive layer so as to provide a visible image upon exposure to light. Examples of the color changing agent include the above-enumerated dyes, and, in addition, diphenylamine, dibenzylaniline, triphenylamine, diethylaniline, diphenyl-p-phenylenediamine, p-toluidine, 4,4′-biphenyldiamine, o-chloroaniline, p,p′,p″-hexamethyltriaminotriphenylmethane, p,p′-tetramethyldiaminotriphenylmethane, p,p′,p″-traiminotriphenylcarbinol, Leuco Methyl Violet, etc.

Specific examples of the adhesion accelerator are the compounds disclosed in Japanese Patent Publication No. 9177/75 (corresponding to U.S. Pat. No.

3,622,334), e.g., benzimidazole, benzothiazole, benzoxazole, benzotriazole, etc., and the compounds disclosed in Japanese Patent Application (OPI) No. 702/78, e.g., 2-mercaptobenzothiazole, 2-mercaptobenzimidazole, etc.

The photosensitive layer can be formed by dissolving the above-described components in an appropriate solvent and coating the resulting photosensitive coating composition on a desired support by a known coating technique. Solvents that can be used include ethylene dichloride, monochlorobenzene, cyclohexanone, methyl ethyl ketone, acetone, methyl cellosolve acetate, ethyl acetate, methyl acetate, methanol, ethanol, n-propanol, isopropanol, n-butanol, 1-methoxy-2-propanol, 2-methoxy-1-propanol, 1-methoxy-2-acetoxypropane, 2-methoxy-1-acetoxypropane, methyl cellosolve, toluene, xylene, etc., and mixtures thereof.

The photosensitive dry film resist in accordance with the present invention generally has a thickness of from 0.1 to 500 μm, and preferably has a thickness of from 1 to 200 μm.

A support suitable for the photosensitive dry film resist of the present invention is selected from films made of polyamides, polyolefins, polyesters, vinyl polymers, cellulose esters, etc., and preferably has a thickness of from 3 to 100 μm. A particularly preferred flexible support is a transparent polyethylene terephthalate film having a thickness of about 25 μm.

As a protective film, a polyolefin film is suitably used. A particularly preferred protective film is a polyolefin film having a thickness of from 20 to 25 μm.

The photosensitive layer in accordance with the present invention can be developed with a weakly alkaline aqueous solution. The developing solution may contain a minor proportion (e.g., less than about 20% by weight) of a water-miscible organic solvent. Bases to be added can be selected from hydroxides, carbonates, bicarbonates, silicates, phosphates, pyrophosphates, and acetates of alkali metals, ammonium or quaternary ammonium and amines. Specific examples of these bases are lithium hydroxide, sodium hydroxide, potassium hydroxide, ammonium hydroxide, trimethylbenzylammonium hydroxide, sodium carbonate, potassium carbonate, sodium hydrogencarbonate, potassium hydrogencarbonate, sodium silicate, sodium phosphate, potassium phosphate, sodium pyrophosphate, sodium acetate, diethanolamine, triethanolamine, and the like. Of these, a 1 to 2% by weight aqueous solution of sodium carbonate is particularly preferred.

It is surprising that the photosensitive layer of the present invention not only possesses flexibility, adhesion to a base and easy resist peelability after curing, but also exhibits high reproducibility of an original and a high resolving power. Owing to these excellent performance characteristics of the photosensitive layer, the present invention makes it possible to process the base with high accuracy.

Further, the photosensitive layer according to the present invention is so excellent in resistance to cold flow that a photoresist having a low-sticky surface can be obtained. Furthermore, the high adhesion to a base enables the resist film to sufficiently retain its properties during etching with generally employed etching solutions, such as a ferric chloride aqueous solution, an ammonium persulfate aqueous solution, etc., or during ordinary plating processing such as solder plating, copper pyrophosphate plating, copper sulfate plating, etc.

The present invention is now illustrated in greater detail with reference to the following examples, but it should be understood that the present invention is not limited thereto.

EXAMPLES 1 TO 8 AND COMPARATIVE EXAMPLES 1 TO 8

A photosensitive composition was prepared according to the following formulation, wherein the binder is indicated in Table 1 (Invention) or Table 2 (Comparison).

| Photosensitive Composition Formulation | |
|---|---|
| Binder (33 wt % solution) | 45 g |
| 2,4-Dimethylthioxanthone | 0.3 g |
| Ethyl p-dimethylaminobenzoate | 0.33 g |
| Tribromomethylphenylsulfone | 0.4 g |
| Trimethylolpropane triacrylate | 3.0 g |
| Trimethylolpropane diacrylate | 5.0 g |
| Tetraethylene glycol diacrylate | 2.0 g |
| Leuco Methyl Violet | 0.08 g |
| 1-Phenyl-3-morpholinomethyl-1,3,4-triazole-2-thione | 0.09 g |
| Victoria Pure Blue BOH | 0.01 g |
| Methyl Cellosolve | 10 g |

The composition was coated on a 25 μm thick polyethylene terephthalate film to a dry film thickness of about 50 μm and dried in an oven at 100° C. for 5 minutes.

After smoothing the coated surface, the coated support was laminated on a dried copper-clad laminated sheet in such a manner that the coated surface contacted the copper surface at 120° C. by means of a laminator (A24 model manufactured by E.I. Du Pont). The photosensitive layer and the support thus laminated on the base was exposed through the transparent support to light emitted from a 2 Kw ultra-high pressure mercury lamp (Jet Light produced by Oak Co., Ltd.), passing through a high contrast wiring pattern mask composed of a transparent conductor pattern having 100 μm wide lines on an opaque background. The polyethylene terephthalate film was peeled off, and a 1 wt% aqueous solution of sodium carbonate at 40° C. was sprayed on the photosensitive layer at a rate of 1.5 kg/cm² for 60 seconds to remove the unexposed areas. The resulting resist image was observed for quality in terms of the state of image formation and sharpness of image lines, and an increase in line width was measured.

Then, a resolving power chart was printed in place of the wiring pattern, and the unexposed areas were removed in the same manner as described above. The narrowest width of the line of the resulting resist image that was visually distinguishable was taken as resolving power.

Further, the same resist film was laminated onto both sides of a copper-clad (both sides) laminate board (base) having 100 through-holes of 2.5 mm in inner diameter, and both sides of the photosensitive material were exposed to light radiated from a 3 Kw ultra-high paressure mercury lamp (HMW-6-N produced by Oak Co., Ltd.) through circular patterns of 3.0 mm in land diameter. The unexposed areas were removed in the same manner as described above to form a tent over each of the through-holes. In order to evaluate tenting strength, the board was sprayed with 5 Kg/cm² of hot water at 54° C., and the number of tents remaining unbroken on the board was counted to obtain a remaining percentage.

Separately, a copper-clad laminate board having printed thereon a conductor pattern was spray-etched with 1.5 Kg/cm² of a 3.5 wt% aqueous solution of ferric chloride at 40° C. until the exposed copper that was not covered with a resist film was completely dissolved. The etched board was washed with water and dried to thereby obtain a conductor pattern made of copper with the resist still covering thereon. The resist was peeled from the surface of the copper by spraying a 4 wt% aqueous solution of sodium hydroxide at 40° C. for 2 minutes to determine peelability of the resist.

These results obtained are shown in Table 3.

TABLE 2

| Copolymer No. | Comonomer Composition (mol %) | Weight Average Molecular Weight |
|---|---|---|
| 9 | Methyl methacrylate (90) Methacrylic acid (10) | 95,000 |
| 10 | Styrene (50) n-Butyl maleate (50) | 110,000 |
| 11 | n-Hexyl methacrylate (53) Methyl methacrylate (20) Methacrylic acid (27) | 150,000 |
| 12 | Methyl methacrylate (37) Ethyl acrylate (56) Methacrylic acid (7) | 35,000 |
| 13 | Styrene (50) Maleic anhydride (30) Monoisopropyl maleate (20) | 125,000 |
| 14 | Benzyl methacrylate (73) Methacrylic acid (27) | 70,000 |
| 15 | Cyclohexyl methacrylate (40) Methyl acrylate (50) Methacrylic acid (10) | 120,000 |
| 16 | Cyclohexyl methacrylate (60) Methacrylic acid (40) | 130,000 |
| 17 | Acrylonitrile (31) 2-Ethylhexyl methacrylate (6) Methacrylic acid (63) | 95,000 | the resist of the present invention has high tenting strength and good peelability.

EXAMPLE 9

A photosensitive composition having the following formulation was coated on a 25 μm thick polyethylene terephthalate film to a dry film thickness of about 50 μm and dried in an oven at 100° C. for 5 minutes to form a photosensitive layer.

| Photosensitive Composition Formulation | |
|---|---|
| 2,4-Dimethylthioxanthone | 0.3 g |
| Ethyl 4-N,N—dimethylaminobenzoate | 0.3 g |
| Trimethylolpropane diacrylate | 4.0 g |
| Trimethylolpropane triacrylate | 2.4 g |
| 2,2-Bis(acryloyloxyethoxyethoxyphenyl)-propane | 1.6 g |
| Leuco Methyl Violet | 0.08 g |
| Tribromomethylphenylsulfone | 0.4 g |
| 1-Phenyl-3-morpholinomethyl-1,3,4-triazole-2-thione | 0.08 g |
| Victoria Pure Blue BOH | 0.008 g |
| Copolymer No. 1 of Table 1 (33 wt % solution in methyl cellosolve/methyl ethyl ketone (1/1)) | 45 g |
| Methyl cellosolve | 10 g |

The resulting photosensitive dry film resist material was laminated on a copper-clad laminate board in the same manner as in Example 1. A step wedge having an optical density difference of 0.15 was laid thereon, and the photosensitive layer was exposed for 20 count/sec by Jet Light (produced by Oak Co., Ltd.). After the polyethylene terephthalate film was stripped off, the unexposed areas were dissolved by spraying a 1 wt% sodium carbonate aqueous solution at 40° C. for 60 seconds. When the resulting image of the step wedge was read-off, steps up to 8 were found to have been cured.

TABLE 3

| Example No. | Copolymer Used | Quality of Resist Image | Percent Remaining of Tent (%) | Increase in Line Width (μm) | Resolving Power (μm) | Peelability |
|---|---|---|---|---|---|---|
| Example 1 | 1 | good | 100 | +5 | 50 | good |
| Example 2 | 2 | " | 100 | +8 | 50 | " |
| Example 3 | 3 | " | 100 | +2 | 50 | " |
| Example 4 | 4 | " | 100 | +2 | 30 | " |
| Example 5 | 5 | " | 100 | +8 | 50 | " |
| Example 6 | 6 | " | 100 | +7 | 50 | " |
| Example 7 | 7 | " | 100 | +4 | 50 | " |
| Example 8 | 8 | " | 100 | +8 | 60 | " |
| Comparative Example 1 | 9 | poor development | — | — | — | — |
| Comparative Example 2 | 10 | good | 90 | +60 | 75 | poor |
| Comparative Example 3 | 11 | " | 83 | +35 | 75 | " |
| Comparative Example 4 | mixture of 12 and 13 | partial disappearance | 95 | +40 | 150 | good |
| Comparative Example 5 | 14 | good | 96 | +15 | 75 | poor |
| Comparative Example 6 | 15 | poor development | — | — | — | — |
| Comparative Example 7 | 16 | partial disappearance | 28 | +20 | 75 | good |
| Comparative Example 8 | 17 | " | 78 | +20 | 100 | " |

It is apparent from the results of Table 3 that the resist image obtained by using the polymers of the present invention has high quality, excellent reproducibility of image line width and high resolving power. Further, Further, a resist image of a wiring pattern obtained by using the photosensitive composition of the present invention had a resolving power of 50 μm, showing faithful reproduction of the original line width. Besides, the resist was sufficiently resistant to a ferric chloride etching solution, a copper sulfate plating solution, a copper pyrophosphate plating solution, or a soldering solution.

Furthermore, peeling of the resulting resist could be carried out by spraying 1.5 Kg/cm² of a 4 wt% sodium hydroxide aqueous solution at 40° C. for a period of 2 minutes.

While the invention has been described in detail and with reference to specific embodiments thereof, it will be apparent to one skilled in the art that various changes and modifications can be made therein without departing from the spirit and scope thereof.

What is claimed is:

1. A photopolymerizable photoresist composition in the form of a sheet or roll on a transparent polyethylene terephthalate releasable film support, consisting essentially of (A) an addition polymerizable unsaturated compound having at least two ethylenically unsaturated double bonds per molecule in an amount of from 7.5 to 55% by weight, (B), a photopolymerization initiator in an amount of from 0.1 to 10% by weight, and (C) a binder in an amount of 20 to 80% by weight, wherein said binder consists essentially of a copolymer represented by formula (I)

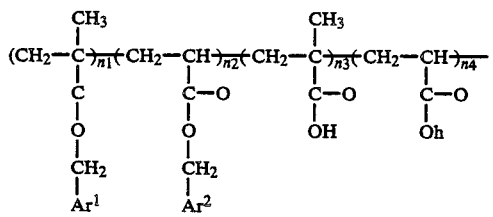

wherein $Ar^1$ and $Ar^2$ each represent a substituted or unsubstituted phenyl group; and $n_1$, $n_2$, $n_3$, and $n_4$ each represents a mol % of the respective repeating units set forth in formula (I), wherein $n_1$ is from 0 to about 70; $n_2$ is from 0 to about 70; $n_3$ is from about 5 to 50; and $n_4$ is from about 5 to 50; provided that $n_1$ and $n_2$ are not 0 at the same time, the sum of $n_1$ and $n_2$ is from about 20 to 70, the sum of $n_3$ and $n_4$ is from about 30 to 80, wherein said copolymer has a weight average molecular weight of from 10,000 to 500,000.

2. A photopolymerizable composition as in claim 1, wherein the sum of $n_1$ and $n_2$ is from about 45 mol % to 55 mol %, $n_3$ is from about 15 mol % to 35 mol %, and $n_4$ is from about 7 mol % to 30 mol %.

3. A photopolymerizable composition as in claim 1, wherein $Ar^1$ and $Ar^2$ each represent phenyl, p-methylphenyl, m-methylphenyl, o-methylphenyl, p-ethylphenyl, o-ethylphenyl, p-isopropylphenyl, p-methoxyphenyl, p-chlorophenyl, m-chlorophenyl, o-chlorophenyl, p-bromophenyl, 2,4-dimethylphenyl, 3,4-dimethylphenyl and 3,4-dimethoxyphenyl groups.

4. A photopolymerizable composition as in claim 1, wherein $Ar^1$ and $Ar^2$ each represent a phenyl group.

5. A photopolymerizable composition as in claim 2, wherein $Ar^1$ and $Ar^2$ each represent phenyl, p-methylphenyl, m-methylphenyl, o-methylphenyl, p-methoxyphenyl, p-chlorophenyl, m-chlorophenyl, o-chlorophenyl, p-bromophenyl, 2,4-dimethylphenyl, 3,4-dimethylphenyl and 3,4-dimethylphenyl groups.

6. A photopolymerizable composition as in claim 2, wherein $Ar^1$ and $Ar^2$ represent a phenyl group.

7. A photopolymerizable composition as in claim 1, wherein said copolymer has a weight average molecular weight of from about 20,000 to 250,000.

8. A photopolymerizable composition as in claim 2, wherein said copolymer has a weight average molecular weight of from about 20,000 to 250,000.

9. A photopolymerizable composition as in claim 1, wherein the polymerizable unsaturated compound is present in the photopolymerizable composition in an amount of from about 15 to 45% by weight, based on the total weight of the composition.

10. A photopolymerizable composition as in claim 2, wherein the polymerizable unsaturated compound is present in the photopolymerizable composition in an amount of from about 15–45% by weight, based on the total weight of the composition.

11. A photopolymerizable composition as in claim 7, wherein the polymerizable unsaturated compound is present in the photopolymerizable composition in an amount of from about 15 to 45% by weight, based on the weight of the composition.

12. A photopolymerizable composition as in claim 8, wherein the polymerizable unsaturated compound is present in the photopolymerizable composition in an amount of from about 15 to 45% by weight, based on the total weight of the composition.

13. A photopolymerizable composition as in claim 1, wherein the photopolymerizable initiator is present in the photopolymerizable composition in an amount of from about 0.2 to 6% by weight, based on the total weight of the composition.

14. A photopolymerizable composition as in claim 2, wherein the photopolymerizable initiator is present in the photopolymerizable composition in an amount of from about 0.2 to 6% by weight, based on the total weight of the composition.

* * * * *